Feb. 10, 1953 C. J. NORTON 2,628,308
HYBRID WAVE GUIDE MIXER
Filed Feb. 1, 1949
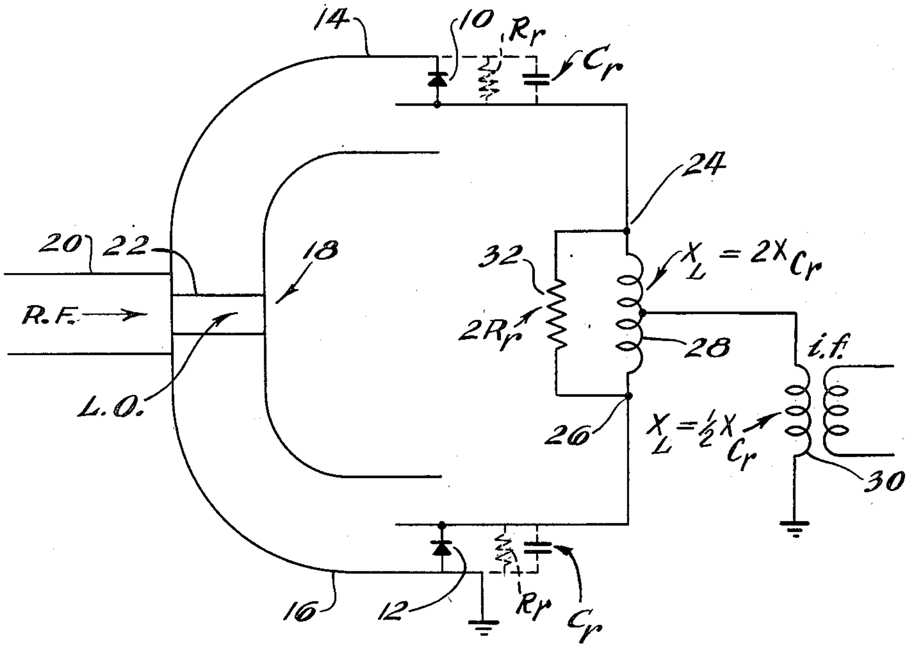
INVENTOR.
Clyde J. Norton
BY [signature]
Attorney Patented Feb. 10, 1953

2,628,308

UNITED STATES PATENT OFFICE 2,628,308

HYBRID WAVE GUIDE MIXER

Clyde J. Norton, San Fernando, Calif., assignor to Sylvania Electric Products Inc., a corporation of Massachusetts Application February 1, 1949, Serial No. 73,986

8 Claims. (Cl. 250—20)

The present invention relates to radio circuits, in more particular to mixers for combining a received signal with a local oscillation to produce a heterodyne or intermediate-frequency signal as is usual in superheterodyne receivers. The invention yields a special advantage at ultra-high frequencies where wave guides are used for signal transmission, and where crystal diodes and like non-linear devices are used as modulators or rectifiers. A circuit is provided for minimizing transmission of locally generated noise into the output circuit from a mixer or the like.

At wave-guide frequencies, first detectors of mixers commonly include two diodes, which may be arranged to feed the intermediate-frequency circuit in push-pull or in parallel. This invention in one aspect represents an improvement in mixers embodying the parallel type of feed. In this type of mixer the output of the local oscillator is applied out-of-phase to two diodes by a hybrid wave-guide junction while the received signal is applied by the hybrid junction to the two diodes in like phase. The two diodes act in parallel to drive the heterodyne output circuit. The local oscillator noise in theory should be self-canceling but, due to various factors including circuit unbalance and cross-modulation among the signal components in the diodes, a troublesome noise level is usually transmitted to the output circuit.

In accordance with the present invention, a push-pull damping or noise-absorbing circuit is interposed between the diodes and the output circuit. Based on certain considerations, the interposed circuit should include a resistive component optimally matching the effective resistance of the two diodes in series, to absorb half the noise energy transmitted from the local oscillator and to cause the other half of that energy to be absorbed internally in the mixer. With this arrangement there is greatly reduced tendency of local oscillator noise to emerge in the parallel-fed output circuit despite normal circuit unbalance.

The push-pull load interposed between the diodes and the parallel-fed output circuit (as a matter apart from the hybrid junction feed or comparable network) is also a factor in reducing the noise that originates in the detector diodes or like non-linear devices, as compared to a parallel-diode circuit without such interposed load.

The nature of the invention and its further features of novelty will be more fully appreciated from the following detailed disclosure of an illustrative embodiment shown in the accompanying drawing, a somewhat schematic circuit diagram.

In the drawing, each of a pair of point-contact crystal rectifiers 10, 12 is coupled in conventional manner to its respective wave guide 14, 16, which wave guides are extensions of two arms of a magic-T junction energized by a local oscillator and a selective signal receiver (both not shown). The received signal enters the junction through wave guide 20 in the H-plane, as into the shunt-T portion of the magic-T. The signal from the local oscillator is fed into the junction through vertical wave-guide section 22 in the E-plane, as into the series-T portion of the magic-T. The received signal appears at diodes 10 and 12 in like phase, whereas the signal from the local oscillator appears at the two diodes in mutually opposite phase.

Accompanying the center frequency of the oscillator is an entire spectrum of noise components. Some of these are of proper frequency difference from the center frequency to produce a beat within the pass band of the heterodyne circuit. Considering any one of such noise side-band components, it has essentially the same instantaneous relationship to the center frequency component at diode 10 as at diode 12. This applies for a single side band in relation to the center frequency component over an interval of time, and it also applies to the range of troublesome noise components accompanying the center frequency component of the oscillator signal. Logically there should be complete cancellation of this type of noise in the parallel output circuit. Such is not found to be the case in practice for various reasons. Rather than self-cancellation, there is a high degree of reflection of the noise energy, which cross-modulates with signal components to appear in the output. Also, there is an appreciable minimum of unbalance between the diodes and asymmetry in their circuit connections that causes noise transmission into the output circuit.

In the circuit shown, there is a parallel output connection from each diode 10, 12 to input coil 30 of an intermediate-frequency amplifier (not shown). The wave guide serves as a common ground connection between the two diodes. The opposite diode terminals are arranged to energize the "live" end of coil 30, the opposite end of the coil being grounded and thus connected as a load on the parallel diodes.

Between those terminals of the diodes opposite their common ground connection and the "live" terminal of coil 30 there is interposed a center-tapped resistive impedance, here consisting of resistor 32 and center-tapped coil or inductor 28. Signal is impressed on terminals 24 and 26 of this coil in push-pull, to the extent that there are out-of-phase signal components at the diodes; and as to such components the crystal diodes act as sources in series. The push-pull signal energy is not coupled out of coil 28 as might be expected in conventional push-pull circuits; it is absorbed in resistor 32 substantially to the extent that it is not consumed within diodes 10 and 12. Resistor 32 is of the mean or effective value of resistance of the two-diodes in series. The effective resistance of the rectifiers which are non-linear is an approximate but very real quantity.

Diode mixers 10 and 12 may be considered as generators having internal capacitance $C_r$ and internal resistance $R_r$. Inductor 28 and the two capacitances $C_r$ in series should be proportioned as a resonant impedance at the intermediate frequency, effective over a broad band because of loading resistor 32 in shunt with that inductor. By this means, the noise components that appear out-of-phase at terminal 24 in relation to terminal 26 are effectively damped and the transmission of such noise component to the intermediate-frequency circuit is minimized. The noise voltage in the diodes is held to a minimum, consistent with the foregoing, so that cross-modulation of the noise and other signal components is also held to a minimum.

The signal energy appears in-phase at terminal 26 in relation to terminal 24. For this reason there is no absorption of signal energy in resistor 32. The two halves of coil 28 operate in parallel to deliver signal energy to coil 30, and due to the leakage reactance of coil 28 this coil interposes only a very small reactance between the diodes and the intermediate-frequency unit. Diodes 10 and 12 act as parallel generators to drive coil 30. For best impedance matching, this coil (loaded by its secondary) should have a reactance approximately equal to the capacitive reactance of the two diodes in parallel with due allowance for the reactance of the mutually coupled halves of coil 28.

Efficient transmission of signal voltage to the intermediate-frequency circuit is thus effected while the locally developed noise components are largely absorbed. The dual input paths to the two crystals circuit yields in-phase signal components and out-of-phase noise components, enabling separate treatment of the wanted and unwanted voltages. The magic-T junction is not the only hybrid junction known to have this phasing property, the so-called "rat-race" also having this property. A latitude of input circuitry will occur to those skilled in the art in substitution for that in the illustrative embodiment.

Even apart from the hybrid junction in the input to the diodes, some advantage is gained through use of the coupling circuit described, in reducing effects of random noise in the diodes. Thus noise developed in one diode is transmitted through half of coil 28, inductively coupled to the other half of coil 28, and is partly absorbed in resistor 32.

Other useful features, changes in detail and varied application of the foregoing specific circuit will occur to those skilled in the art; wherefore the appended claims should be allowed such broad interpretation as is consistent with the spirit and scope of the invention.

What is claimed is:

1. A mixer for combining received signal energy and a locally generated oscillation, comprising a double-T waveguide junction having two input arms and two output arms and a point-contact crystal rectifier in each of the two output arms of the waveguide junction, the locally generated oscillation being coupled at that input arm of the junction that is proper to yield a voltage at one of said rectifiers which is out of phase with the voltage at the other of said rectifiers, a center-tapped inductance connected between said rectifiers, the reactance of said inductance being equal at heterodyne frequency to twice the capacitive reactance of one of said rectifiers, a resistor shunting said inductance and having a value equal to twice the effective resistance of one of said rectifiers, and an output circuit having an inductive reactance approximately equal to half the capacitive reactance of one of said rectifiers, said output circuit being connected between the center tap of said first-mentioned inductance and a point of stable potential in said double-T waveguide junction.

2. A heterodyne detector comprising a double-T waveguide junction means for separately impressing a received signal and a locally generated signal respectively on two input arms of the waveguide junction, the locally generated signal being applied at that input arm of the junction to appear at the output pair of arms of the waveguide junction in mutually out-of-phase relationship, a non-linear impedance element in each of the output two arms, a heterodyne output circuit connected between a point of stable potential in said double-T waveguide junction and opposite terminals of both said impedance elements for parallel feed, and a push-pull loading circuit interposed as a connection between one side of said heterodyne circuit and said impedance elements.

3. A heterodyne detector comprising a pair of non-linear resistive elements having input connections for applying a locally generated oscillation to the non-linear resistive elements out of phase and a received signal to the non-linear resistive elements in phase, each one of said resistive elements having a connection in common with the other and a terminal opposite said common connection, a push-pull loading device connected between said opposite connections, and a parallel-fed output circuit between said common connection and the center-point of said push-pull loading device.

4. A mixer for combining received signal energy and a locally generated oscillation, comprising a hybrid waveguide junction, a point-contact rectifier in each of two arms of the hybrid junction, the locally generated oscillation being coupled properly to apply locally developed voltages to said two rectifiers mutually in out-of-phase relation, a center-tapped reactor connected between said rectifiers, a resistor of twice the mean value of one of said crystal rectifiers shunting said reactor, and an output circuit connected between the center-point of the reactor and said hybrid junction.

5. A mixer for combining received signal energy and a locally generated oscillation comprising a hybrid waveguide junction having two input arms and two output arms, the locally generated oscillation being fed into that input arm which transmits the signal in out-of-phase relation to said output arms, a non-linear resistive element in each of said output arms, said elements each having a terminal connected to a terminal of the other and to a point of stable potential in the hybrid junction, a center-tapped resistive reactance device between the opposite terminals of said elements, and an output circuit between the center tap of the reactance device and said point of stable potential.

6. A heterodyne detector comprising a pair of diodes connected in series with each other and with a center-tapped inductive device to form a closed circuit for locally developed undesired signal components, said diodes being polarized so as to conduct such components concurrently, input connections to said diodes to apply two different signals to said diodes, one signal in like phase to the diodes and the other signal in opposite phase to the diodes, and an additional output circuit between the center-tap of said device and a point between said series diodes.

7. A heterodyne detector in accordance with claim 6, wherein said inductance is shunted by a resistor substantially matching the mean resistance of said diodes in series.

8. A mixing circuit including a pair of diodes having a common connection, connected in series-aiding polarization to the terminals of the center-tapped impedance and having oppositely phased connections to a source of local oscillations and in-phase connections to a received signal source, and an output circuit connected between the center-tap of said impedance and the common connection of said diodes.

CLYDE J. NORTON.

REFERENCES CITED

The following references are of record in the file of this patent:

UNITED STATES PATENTS

| Number | Name | Date |
|---|---|---|
| 1,968,610 | Mathieu | July 31, 1934 |
| 2,008,859 | Ganz | July 23, 1935 |
| 2,220,201 | Bliss | Nov. 5, 1940 |
| 2,296,107 | Kimball | Sept. 15, 1942 |
| 2,304,135 | Wise | Dec. 8, 1942 |
| 2,445,895 | Tyrrell | July 27, 1948 |
| 2,446,188 | Miller | Aug. 3, 1948 |
| 2,462,893 | Pontecorvo | Mar. 1, 1949 |
| 2,468,166 | Bruck | Apr. 26, 1949 |